(12) United States Patent
Engel et al.

(10) Patent No.: US 8,435,891 B2
(45) Date of Patent: May 7, 2013

(54) CONVERTING METAL MASK TO METAL-OXIDE ETCH STOP LAYER AND RELATED SEMICONDUCTOR STRUCTURE

(75) Inventors: Brett H. Engel, Hopewell Junction, NY (US); Ying Li, Newburgh, NY (US); Viraj Y. Sardesai, Poughkeepsie, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/151,646

(22) Filed: Jun. 2, 2011

(65) Prior Publication Data

US 2012/0306093 A1 Dec. 6, 2012

(51) Int. Cl.
*H01L 21/283* (2006.01)
(52) U.S. Cl.
USPC ............. 438/667; 438/768; 257/E21.158
(58) Field of Classification Search ........... 438/667, 438/768; 257/E21.158
See application file for complete search history.

(56) References Cited

U.S. PATENT DOCUMENTS

| | | | |
|---|---|---|---|
| 3,941,630 A | 3/1976 | Larrabee | |
| 4,314,874 A | 2/1982 | Abe et al. | |
| 4,496,419 A | 1/1985 | Nulman et al. | |
| 6,214,683 B1 | 4/2001 | Xiang et al. | |
| 6,287,958 B1 | 9/2001 | Reinberg | |
| 6,479,379 B2* | 11/2002 | Reinberg | 438/635 |
| 6,620,721 B1* | 9/2003 | Lee | 438/612 |
| 2005/0282395 A1* | 12/2005 | Chang et al. | 438/740 |
| 2008/0241575 A1* | 10/2008 | Lavoie et al. | 428/620 |

* cited by examiner

*Primary Examiner* — Alexander G. Ghyka
*Assistant Examiner* — Stanetta Isaac
(74) *Attorney, Agent, or Firm* — Yuanmin Cai; Hoffman Warnick LLC

(57) ABSTRACT

A method includes providing a semiconductor structure including a plurality of devices; depositing a nitride cap over the semiconductor structure; forming an aluminum mask over the nitride cap, the aluminum mask including a plurality of first openings; converting the aluminum mask to an aluminum oxide etch stop layer; and performing middle-of-line fabrication processing, leaving the aluminum oxide etch stop layer in place. A semiconductor structure includes a plurality of devices on a substrate; a nitride cap over the plurality of devices; an aluminum oxide etch stop layer over the nitride cap; an inter-level dielectric (ILD) over the aluminum oxide etch stop layer; and a plurality of contacts extending through the ILD, the aluminum oxide etch stop layer and the nitride cap to the plurality of devices.

17 Claims, 7 Drawing Sheets

CONVERTING METAL MASK TO METAL-OXIDE ETCH STOP LAYER AND RELATED SEMICONDUCTOR STRUCTURE

BACKGROUND

1. Technical Field

The disclosure relates generally to semiconductor fabrication, and more particularly, to methods of using a metal mask and converting it to a metal oxide etch stop layer, and a related semiconductor structure.

2. Background Art

Middle-of-line (MOL) fabrication during semiconductor device manufacture includes operations performed on the semiconductor wafer during and following first metallization. Current MOL processing includes using an etch stop layer (ESL) that is deposited and then selectively etched/opened. The openings in the ESL are then used to control critical dimensions (CDs) of contacts to an active region. The active region includes a number of semiconductor devices, e.g., transistors, to which the contacts are electrically coupled. This approach to control contact CDs is complicated because the ESL material is often difficult to etch, thus making controlling the CDs more difficult. Metal hard masks are not a viable solution because the conductive metal film cannot exist at each level for operability issues, and thus must be removed at each level.

BRIEF SUMMARY

A first aspect of the disclosure provides a method comprising: providing a semiconductor structure including a plurality of devices; depositing a nitride cap over the semiconductor structure; forming an aluminum mask over the nitride cap, the aluminum mask including a plurality of first openings; converting the aluminum mask to an aluminum oxide etch stop layer; and performing middle-of-line fabrication processing, leaving the aluminum oxide etch stop layer in place.

A second aspect of the disclosure provides a semiconductor structure comprising: a plurality of devices on a substrate; a nitride cap over the plurality of devices; an aluminum oxide etch stop layer over the nitride cap; an inter-level dielectric (ILD) over the aluminum oxide etch stop layer; and a plurality of conductive contacts extending through the ILD, the aluminum oxide etch stop layer and the nitride cap contacting the plurality of devices.

A third aspect of the disclosure provides a method comprising: providing a semiconductor structure including a plurality of devices; depositing a nitride cap over the semiconductor structure; forming a metal mask over the nitride cap; forming a plurality of first openings into the nitride cap using the metal mask; converting the metal mask to a metal oxide etch stop layer including a metal oxide of the metal; and performing middle-of-line fabrication processing, wherein the metal oxide etch stop layer remains in place in a final semiconductor product.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
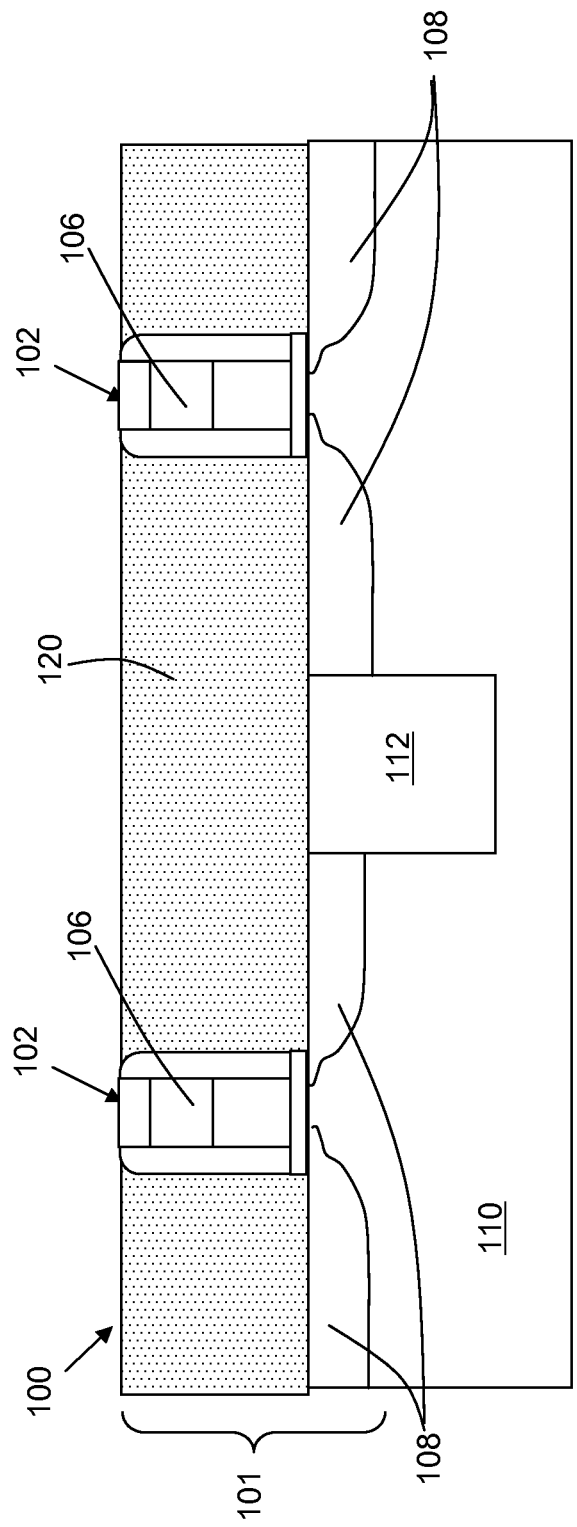
FIGS. 1-7 show cross-sectional views of a semiconductor structure during fabrication according to embodiments of the invention, with FIG. 7 showing an embodiment of a semiconductor structure according to embodiments of the invention.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

As indicated above, the disclosure provides methods of converting a metal mask to a metal oxide for use as an etch stop layer (ESL) capable of controlling critical dimensions of contacts to an active region of a semiconductor structure. Embodiments of the invention will be described relative to a 22 nanometer technology node. It is understood that any dimensions provided relate to that technology node and that modifications of dimensions may be varied to accommodate different technology nodes.

Referring to the drawings, FIG. 1 shows a cross-sectional view of a preliminary semiconductor structure 100. Semiconductor structure 100 includes an active region 101 including a plurality of devices 102, which in the example shown includes a number of transistors. Each transistor may include, for example, a gate 106, source/drain regions 108 built over or within a semiconductor substrate 110 and trench isolations 112 between source/drain regions 108. Other details of the transistors and other structures have been omitted for clarity. Although shown as transistors, it is understood that devices 102 may include any form of semiconductor device typically found on an active region 101 of a semiconductor structure. In addition, although only two semiconductor devices 102 are shown, it is understood that many more are typically provided. Semiconductor structure 100 may be provided using any now known or later developed fabrication techniques.

A dielectric layer 120 encompasses semiconductor devices 102. Dielectric layer 120 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof. Substrate 110 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Figure 2:
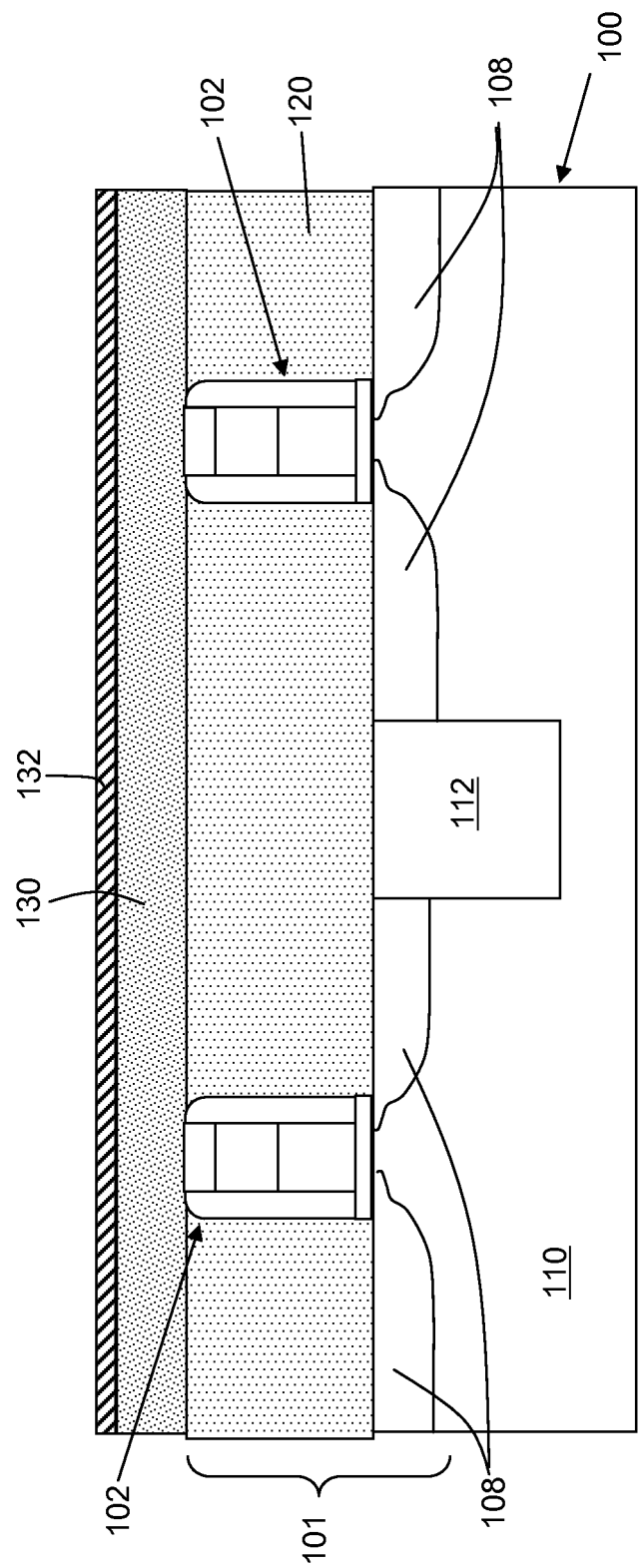

FIG. 2 shows depositing a nitride cap 130 over semiconductor structure 100. Nitride cap 130 may include any appropriate insulative nitride material such as silicon nitride ($Si_3N_4$) and may have a thickness in the range of approximately 10 to 40 nanometers. Although the term "cap" is used, it is understood that the cap is a layer of material. "Depositing," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
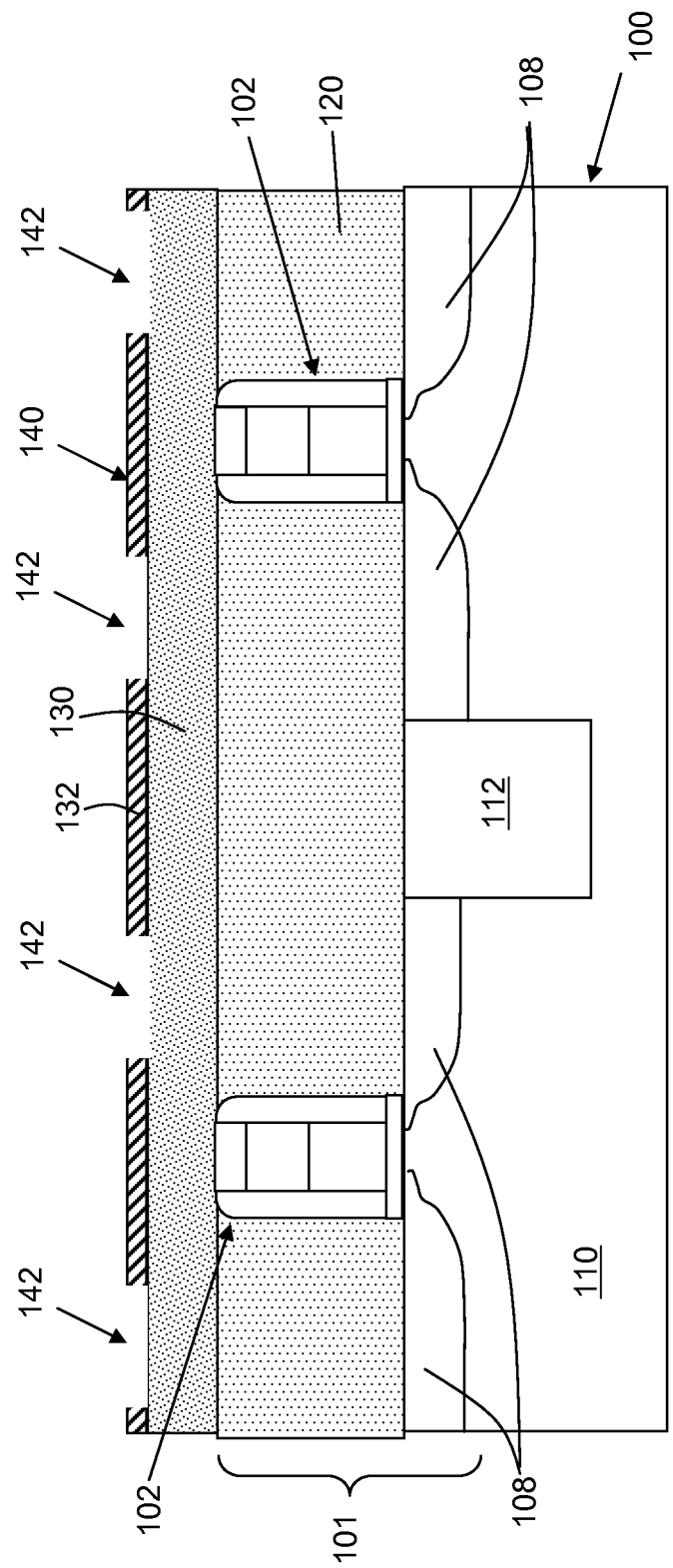

FIGS. 2 and 3 show forming a metal mask 140 (FIG. 3) over nitride cap 130. Metal mask 140 may include a plurality of first openings 142 (FIG. 3), which may or may not extend partially into nitride cap 130. This process may include, as shown in FIG. 2, depositing a metal 132 having a thickness in a range of approximately 2 to 15 nanometers. In one embodiment, the metal includes aluminum (AL). However, other metals capable of the conversion discussed herein may also be possible. Metal mask 140 may be formed using any now known or later developed techniques such as depositing a photoresist, patterning the photoresist, etching the photoresist and then using the mask to etch plurality of first openings 142. The etching processes may include, for example, a reactive ion etch, which is anisotropic. The extent to which first openings 142 extend into nitride cap 130 is not significant, and may be to a surface or a minimal amount into a surface of nitride cap 130 sufficient to ensure proper sizing of first openings 142 in metal mask 140.

Figure 4:
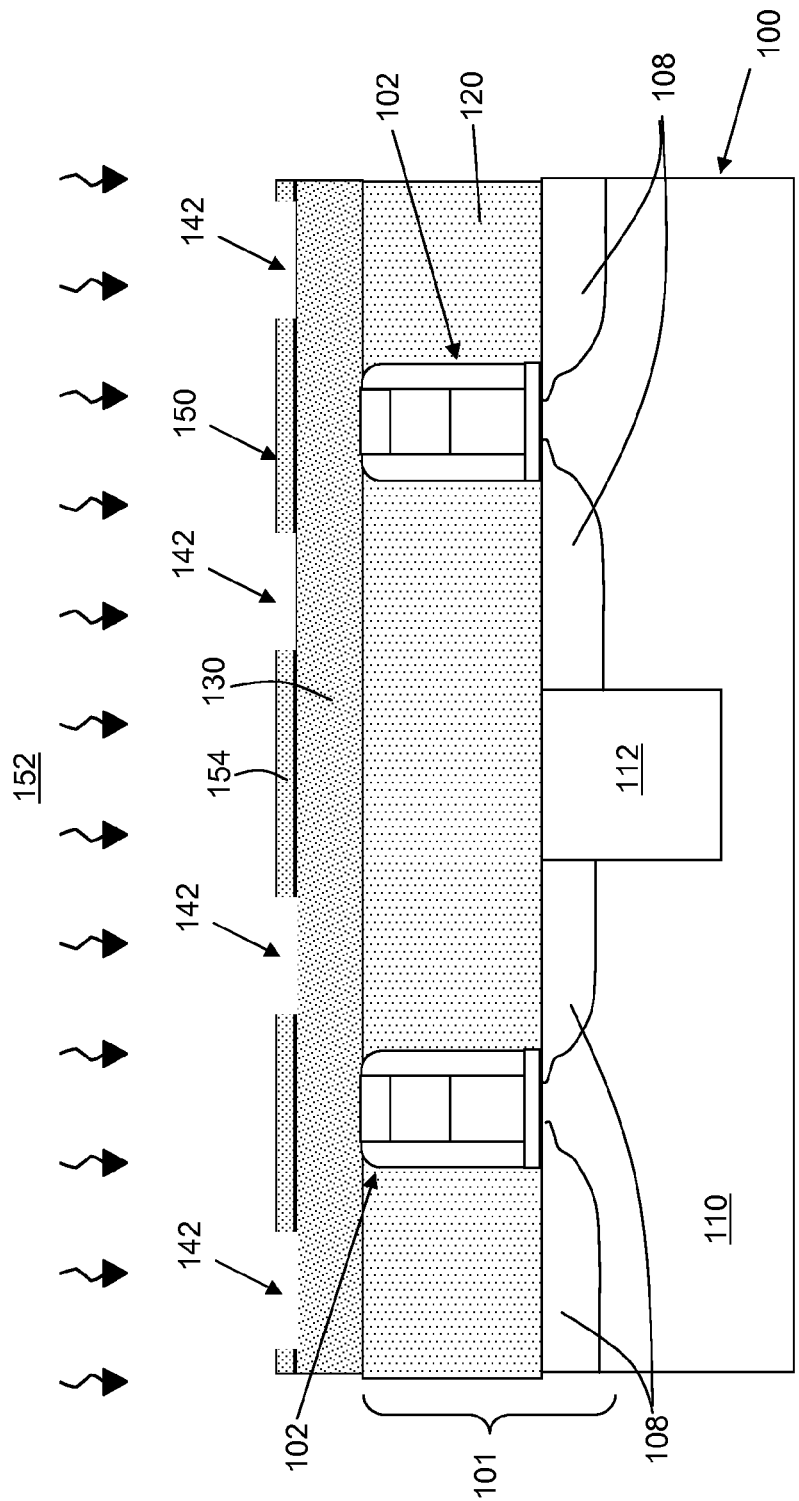

FIG. 4 shows converting metal mask 140 (FIG. 3) to an insulative etch stop layer 150. The converting 152 may include oxidizing metal mask 140 to form a metal oxide. Ideally, almost all of metal mask 140 is converted, however, only top portion thereof may be adequate to form etch stop layer 150. In one embodiment, where the metal includes aluminum, the metal oxide includes aluminum oxide 154 (e.g., $Al_2O_3$, $AlO_x$, etc.). Oxidizing 152 may include using an oxidation plasma. In this case, oxidation 152 is not an anodic oxidation. The oxidation may include exposing the aluminum to an oxidizing plasma environment, a wet etch, or exposing to an oxidizing slurry (e.g., a hydroxyl-containing slurry) during a chemical mechanical polishing (CMP). Exposure to an oxidizing plasma environment will preferentially oxidize horizontal aluminum surfaces rather than vertical surfaces due to incoming ion bombardment, resulting in a directional oxidation. One embodiment of an oxidizing plasma environment may include, for example, using a chemistry including: oxygen ($O_2$), carbon monoxide (CO), carbon dioxide ($CO_2$), nitrous oxide ($N_2O$), water ($H_2O$), and/or oxygen and argon ($O_2/Ar$). In this example, additive gases for gas phase chemistry only may include, but are not limited to: helium (He), argon (Ar), nitrogen ($N_2$) and/or hydrogen ($H_2$), each of which may be used for uniformity. An operating pressure may be about 2 milliTorr (mT) to about 5 Torr (T). In one embodiment, the operating pressure may be about 1-2 T. An applied bias power may be, for example, about 0 milliWatts per square centimeter ($mW/cm^2$) to about 1000 $mW/cm^2$. In one embodiment, the applied bias power may be about 0 $mW/cm^2$ to about 300 $mW/cm^2$. A plasma source power may be, for example: about 0.5 Watts per cubic centimeter ($W/cm^3$) to about 20 $W/cm^3$. In one embodiment, the plasma power source may be about 2-3 $W/cm^3$. In terms of a wet etch, in one embodiment, this process may include dipping the aluminum into a strong oxidizing bath such as ozonated, distilled or deionized (DI) water (DI $O_3$). This can also be done by dipping the aluminum in nitric acid ($HNO_3$). The oxide thickness can be modulated by bath temperature and dipping time. Insulative etch stop layer 150 may have a thickness in a range of approximately 2 to 15 nanometers; however, as noted above, complete oxidation of metal mask 140 may not be necessary, so some differences in the thickness compared to that of metal mask 140 may be possible.

Figure 5:
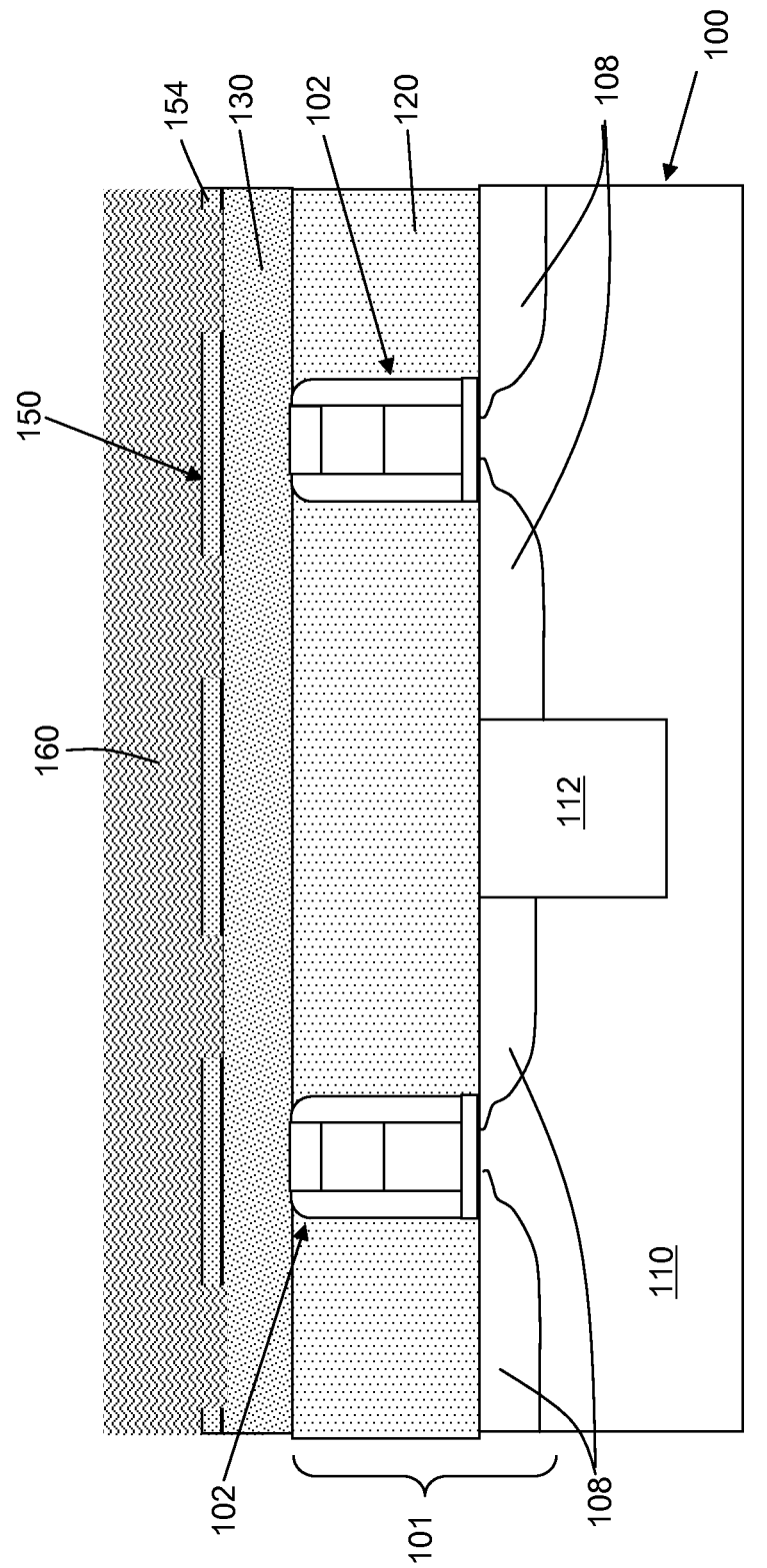
Figure 6:
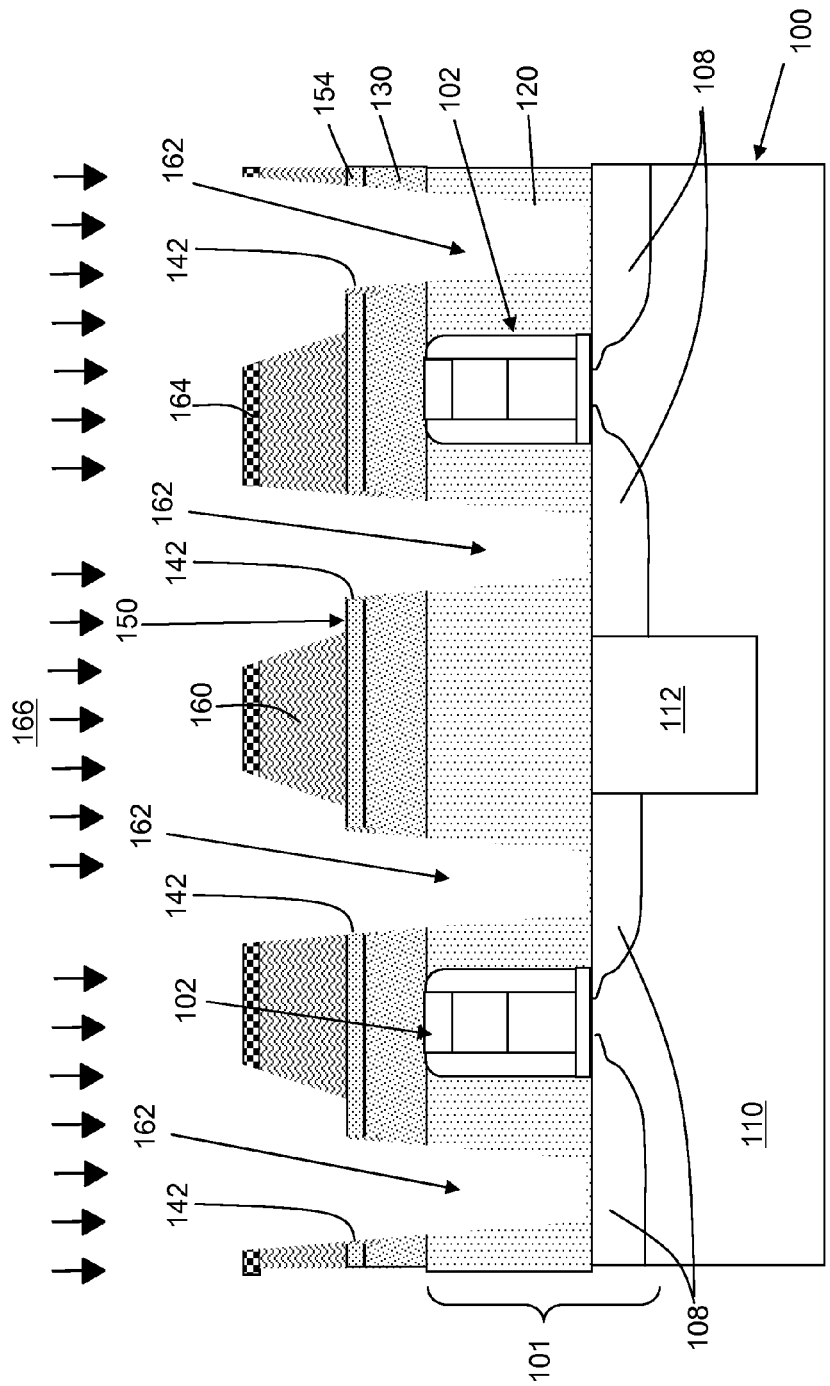
Figure 7:
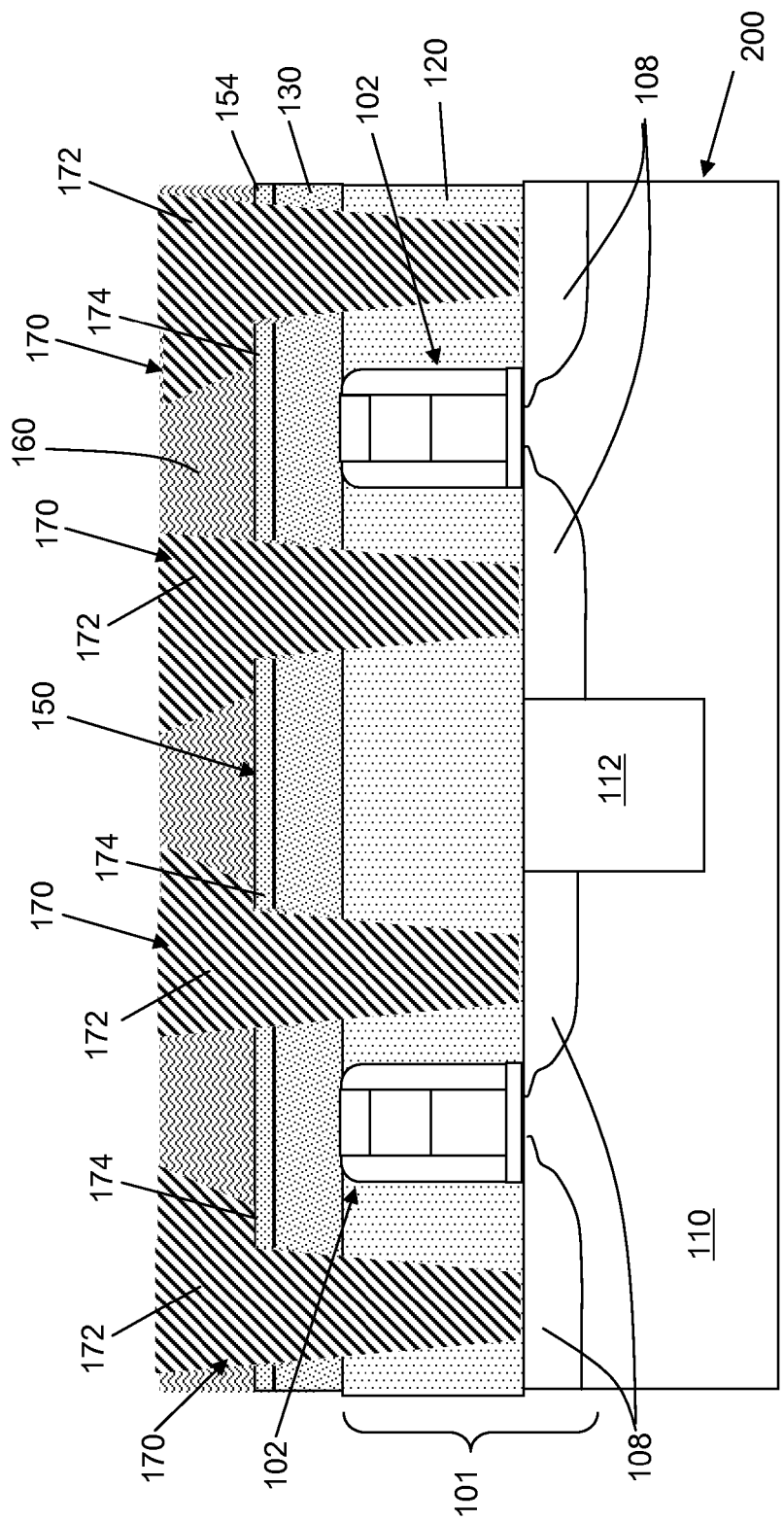

FIGS. 5-7 show performing (subsequent) middle-of-line (MOL) fabrication processing. During this processing, insulative, e.g., aluminum oxide, etch stop layer 150 is left in place. This is in contrast to conventional techniques that use metal masks, which require removal of the metal masks at each level. The MOL processing performing may include, for example, as shown in FIG. 5, depositing an inter-level dielectric (ILD) 160 over insulative etch stop layer 150 and, as shown in FIGS. 6 and 7, forming contacts 170 (FIG. 7) to plurality of devices 102. ILD 160 may include any dielectric listed relative to dielectric 120, or any other high dielectric constant material such as but not limited to: zirconium silicate ($ZrSiO_x$), zirconium oxide ($ZrO_2$), silicon oxide ($SiO_2$), silicon nitride ($Si_3N_4$), silicon oxynitride (SiON), another high-k material or any combination of these materials. As shown in FIG. 6, contact forming may include forming a plurality of second openings 162 through ILD 160 substantially aligned with plurality of first openings 142 in insulative etch stop layer 150 and through nitride cap 130 (and dielectric 120, where provided) to plurality of devices 102. The portions of second openings 162 in ILD 160 typically are larger than first openings 142 in etch stop layer 150. In this fashion, any variation in critical dimension of second openings 162 in ILD 160 will not affect the critical dimension of the lower portion of second openings 162 (i.e., contact holes) underneath etch stop layer 150 since the critical dimension of second openings 162 at the lower portions thereof, under etch stop layer 150, are determined by the critical dimension of first openings 142 in etch stop layer 150. As shown in FIG. 6, second openings 162 may be formed by depositing and patterning a photoresist 164 over ILD 160 to form a photomask, and performing a reactive ion etch (RIE) 166 through ILD 160, nitride cap 130 (and dielectric layer 120) to devices 102, e.g., source/drain regions 108. RIE 166 includes an anisotropic dry etch, and cannot be a chemical or isotropic wet etch. As indicated in FIG. 6, insulative etch stop layer 150 is difficult to etch by RIE 166. Consequently, insulative etch stop layer 150 retains a critical dimension of plurality of first openings 142 during forming of second openings 162 through ILD 160, etch stop layer 150 nitride cap 130 and dielectric layer 120 to devices 102, e.g., source/drain regions 108. More particularly, first openings 142 retain their critical dimensions and control the overall critical dimensions of second openings 162 and hence, contacts 170 (FIG. 7.). Photoresist 164 may be removed using any now known or later developed technique.

As shown in FIG. 7, contact 170 forming also includes depositing a metal 172 in plurality of first and second openings 142, 162 (FIG. 6). Metal 172 may include any metal conventionally used for contacts 170, e.g., copper, aluminum, etc. This process may include use of any required liner material (not shown), e.g., titanium nitride (TiN), tantalum nitride (TaN), tantalum (Ta), titanium (Ti), etc. Although contacts 170 are shown connected to source/drain regions 108, it is understood that they could be coupled to other regions of semiconductor devices 102, e.g., gates 106 (FIG. 1). Subsequent, CMP to remove excess metal 172 may be performed in a known fashion. As shown in FIG. 7, due to the etch resistant insulative etch stop layer 150 and partial non-alignment of second openings 162 (FIG. 6) (or purposeful dual Damascene processing to create contacts 170 and wiring (not shown)), at least one contact 170 may extend laterally over a portion 174 of insulative etch stop layer 150 and through a first opening 142 in insulative etch stop layer 150.

Although MOL processing has been shown as being performed at a first metal layer (M1), it is understood that teachings of the invention may also be employed at later MOL layers, and perhaps in back-end-of-line (BEOL) processing. Further processing follows that shown.

FIG. 7 shows a resulting semiconductor structure 200 that includes plurality of devices 102 on substrate 110, and nitride cap 130 over plurality of devices 102. In contrast to conventional structures, structure 200 also includes insulative (e.g., aluminum oxide) etch stop layer 150 over nitride cap 130. ILD 160 is positioned over insulative etch stop layer 150, and a plurality of conductive contacts 170 extending through ILD 160, insulative etch stop layer 150 and nitride cap 130 (and dielectric 120) contacting devices 102.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from cell phones, toys and other low-end applications to advanced computer products having a display, a keyboard or other input device, and a central processor.

The foregoing drawings show some of the processing associated according to several embodiments of this disclosure. In this regard, each drawing within the flow of the drawings represents a process associated with embodiments of the method described. It should also be noted that in some alternative implementations, the acts noted in the drawings may occur out of the order noted in the figure or, for example, may in fact be executed substantially concurrently or in the reverse order, depending upon the act involved.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
providing a semiconductor structure including a plurality of devices;
depositing a nitride cap over the semiconductor structure;
forming an aluminum mask over the nitride cap, the aluminum mask including a plurality of first openings;
converting only a top portion of the aluminum mask to an aluminum oxide etch stop layer; and
performing middle-of-line fabrication processing, leaving the aluminum oxide etch stop layer in place.

2. The method of claim 1, wherein the aluminum mask has a thickness in a range of approximately 2 to 15 nanometers.

3. The method of claim 1, wherein the performing middle-of-line fabrication processing includes:
depositing an inter-level dielectric (ILD) over the aluminum oxide etch stop layer; and
forming contacts to the plurality of devices inside the ILD.

4. The method of claim 3, wherein the forming contacts includes;
forming a plurality of second openings through the ILD substantially aligned with the plurality of first openings in the aluminum oxide etch stop layer and through the nitride cap to the plurality of devices; and
depositing a metal in the plurality of first and second openings.

5. The method of claim 4, wherein the forming the plurality of second openings includes:
depositing and patterning a photoresist over the ILD to form a photomask; and
performing a reactive ion etch through the ILD and the nitride cap to the plurality of devices using the photomask.

6. The method of claim 3, wherein the aluminum oxide etch stop layer retains a critical dimension of the plurality of first openings during the plurality of second openings forming.

7. The method of claim 3, wherein at least one contact extends laterally over a portion of the aluminum oxide etch stop layer and through an opening in the aluminum oxide etch stop layer.

8. The method of claim 1, wherein the converting the aluminum includes oxidizing the aluminum mask.

9. The method of claim 8, wherein the oxidizing includes using one of an oxidation plasma and exposure to an oxidizing slurry.

10. A method comprising:
providing a semiconductor structure including;
a dielectric layer; and
a plurality of gates formed within the dielectric layer;
depositing a nitride cap directly over the dielectric layer of the semiconductor structure;
forming a metal mask over the nitride cap, the metal mask including a plurality of first openings;
converting the metal mask to an insulative etch stop layer; and
performing middle-of-line fabrication processing,
wherein the insulative etch stop layer remains in place in a final semiconductor product.

11. The method of claim 10, wherein the metal mask includes aluminum, and the converting includes oxidizing to convert the aluminum into the insulative etch stop layer including aluminum oxide.

12. The method of claim 10, wherein the metal mask has a thickness in a range of approximately 2 to 15 nanometers.

13. The method of claim 10, wherein the performing middle-of-line fabrication processing includes:
   depositing an inter-level dielectric (ILD) over the insulative etch stop layer; and
   forming contacts to the plurality of devices through the ILD.

14. The method of claim 13, wherein the forming contacts includes;
   forming a plurality of second openings through the ILD substantially aligned with the plurality of first openings in the insulative etch stop layer and through the nitride cap to the plurality of devices; and
   depositing a metal in the plurality of first and second openings.

15. The method of claim 14, wherein the insulative etch stop layer retains a critical dimension of the plurality of first openings during the plurality of second openings forming.

16. The method of claim 10, wherein at least one contact extends laterally over a portion of the insulative etch stop layer and through an opening in the insulative etch stop layer.

17. The method of claim 10, wherein the oxidizing includes using one of an oxidation plasma and exposure to an oxidizing slurry.

* * * * *